(12) United States Patent
Wang

(10) Patent No.: US 6,693,268 B2
(45) Date of Patent: Feb. 17, 2004

(54) AUTO FEEDBACK AND PHOTO ATTENUATION STRUCTURE OF VERTICAL CAVITY SURFACE EMITTING LASER

(75) Inventor: Cheng-Bin Wang, Kaohsiung (TW)

(73) Assignee: Coretek Opto Corporation, Taipei Hsien (TW)

( * ) Notice: Subject to any disclaimer, the term of this patent is extended or adjusted under 35 U.S.C. 154(b) by 108 days.

(21) Appl. No.: 09/960,664

(22) Filed: Sep. 24, 2001

(65) Prior Publication Data

US 2003/0057355 A1 Mar. 27, 2003

(51) Int. Cl.$^7$ .............................. H01L 27/15; H01S 5/00
(52) U.S. Cl. ...................... 250/205; 250/214.1; 257/82; 372/50
(58) Field of Search ............................. 250/205, 214.1, 250/206; 257/80–84; 372/50, 29.01, 29.011, 29.021

(56) References Cited

U.S. PATENT DOCUMENTS

| | | | | |
|---|---|---|---|---|
| 5,577,064 A | * | 11/1996 | Swirhun et al. | 372/96 |
| 5,751,757 A | * | 5/1998 | Jiang et al. | 372/50 |
| 5,892,786 A | * | 4/1999 | Lott | 372/50 |
| 5,943,357 A | * | 8/1999 | Lebby et al. | 372/50 |
| 5,974,071 A | * | 10/1999 | Jiang et al. | 372/50 |
| 6,023,485 A | * | 2/2000 | Claisse et al. | 372/50 |
| 6,392,256 B1 | * | 5/2002 | Scott et al. | 257/184 |
| 6,483,862 B1 | * | 11/2002 | Aronson et al. | 372/50 |

* cited by examiner

*Primary Examiner*—Stephone B. Allen
(74) *Attorney, Agent, or Firm*—Charles E. Baxley

(57) ABSTRACT

An auto feedback and photo attenuation structure of a vertical cavity surface emitting laser (VCSEL) includes a VCSEL combined with a monitor photodetector (MPD). The thickness of the absorbing layer of the MPD may be adjusted, so that when output light of different wavelengths passes through the MPD, a portion of light may be absorbed by the absorbing layer to function as a feedback path of an auto power control, and a portion of light may penetrate through the absorbing layer, and may satisfy the requirement of the eye safety class I. The thickness of the absorbing layer of the MPD may be controlled precisely, thereby increasing the quality of products and decreasing cost of fabrication.

7 Claims, 5 Drawing Sheets

AUTO FEEDBACK AND PHOTO ATTENUATION STRUCTURE OF VERTICAL CAVITY SURFACE EMITTING LASER

BACKGROUND OF THE INVENTION

1. Field of the Invention

The present invention relates to an auto feedback and photo attenuation structure of a vertical cavity surface emitting laser, consisting of a vertical cavity surface emitting laser (VCSEL) and a monitor photodetector (MPD).

2. Description of the Related Art

A conventional vertical cavity surface emitting laser (VCSEL) 10 in accordance with the prior art shown in FIG. 1 comprises an active region 11 having a first side provided with a P-distributed bragg reflector (P-DBR) 12, and a second side provided with a N-distributed bragg reflector (N-DBR) 13, and a substrate 14 mounted on the bottom of the N-DBR 13. After output of the light, it resonates between the P-DBR 12 and the N-DBR 13 to emit laser light.

Recently, the VCSEL 10 having a short wavelength (850 nm) has been used broadly. The substrate 14 of the VCSEL 10 having a wavelength of 850 nm is often made of GaAs (Gallium Arsenic) which will absorb the light entering the substrate 14, so that the VCSEL 10 may emit light on the top face only. Thus, when the feedback work of an auto power control (APC) is performed, the process of the feedback work of the VCSEL 10 is more difficult than that of the conventional edge emitting laser which emits light at two faces.

The method of the APC of the conventional VCSEL often uses a monitor photodetector (MPD) that is attached on the top, the bottom and the side of the conventional VCSEL.

The conventional VCSEL on the top of which the MPD is mounted is disclosed in the following patents: U.S. Pat. No. 5,136,603; U.S. Pat. No. 5,606,572; U.S. Pat. No. 5,577,064; U.S. Pat. No. 5,742,630; and U.S. Pat. No. 5,751,751.

The conventional VCSEL on the bottom of which the MPD is mounted is disclosed in the following patents: U.S. Pat. No. 5,491,712; U.S. Pat. No. 5,606,572; U.S. Pat. No. 5,663,944; U.S. Pat. No. 5,732,101; U.S. Pat. No. 5,577,064; and U.S. Pat. No. 5,801,402.

The conventional VCSEL on the side of which the MPD is mounted is disclosed in the following patents: U.S. Pat. No. 5,285,466; U.S. Pat. No. 5,491,712; U.S. Pat. No. 5,606,572; U.S. Pat. No. 5,648,979; U.S. Pat. No. 5,663,944; U.S. Pat. No. 5,577,064; U.S. Pat. No. 5,757,836; and U.S. Pat. No. 5,974,071.

The conventional VCSEL on the reflector of which the MPD is mounted is disclosed in the following patents; U.S. Pat. No. 5,475,701; U.S. Pat. No. 5,606,572; U.S. Pat. No. 5,577,064.

In the above-mentioned patents, the reflectivity of the reflector of the conventional VCSEL may be adjusted to provide proper output light to the MPD to function as the basis of the APC. However, the process of the epitaxy growth layer of the conventional VCSEL cannot be controlled easily. If the MPD structure grows therein, the manufacturing process is more difficult, and relatively, the output power obtained by the MPD cannot be controlled easily, so that the work of the APC is more difficult.

With regard to application of the VCSEL having a longer wavelength (1300 nm), it is limited to the problem of the material system, such that the VCSEL having the wavelength of 1300 nm has not been used broadly.

SUMMARY OF THE INVENTION

The light having a wavelength of 850 nm and 1300 nm is an infrared light that cannot be seen by the people. Thus, for consideration of eye safety, the output of the laser light must satisfy the requirement of the eye safety class I. That is, the output of the laser light must satisfy the requirement of 200 to 400 $\mu$W. Thus, the VCSEL whose output power usually exceeds 1 mW has to be attenuated properly so as to satisfy the requirement of the eye safety class I.

The present invention is to provide an auto feedback and photo attenuation structure of a vertical cavity surface emitting laser, wherein the thickness of the absorbing layer of the MPD may be adjusted so as to adjust, in the light output power of the VCSEL having a wavelength of 850 nm and 1300 nm, the power absorbed by the absorbing layer and the power penetrating the MPD, thereby functioning as a feedback path of an auto power control, and satisfying the requirement of the output power of the eye safety class I.

The primary objective of the present invention is to provide an auto feedback and photo attenuation structure of a vertical cavity surface emitting laser (VCSEL) including a VCSEL combined with a monitor photodetector (MPD). The thickness of the absorbing layer of the MPD may be adjusted, so that when output light of different wavelengths passes through the MPD, a portion of light may be absorbed by the absorbing layer to function as a feedback path of an auto power control,; and a portion of the light may penetrate through the absorbing layer, and may satisfy the requirement of the eye safety class I. The thickness of the absorbing layer of the MPD may be controlled precisely, thereby increasing the quality of products and decreasing cost of fabrication.

The MPD includes a substrate and an absorbing layer. For the VCSEL having a wavelength of 1300 nm, the light may pass conveniently, so that the substrate may be transparent. Thus, the purpose of adjusting the power absorbed by the absorbing layer and the power penetrating the MPD may be achieved by adjusting the thickness of the absorbing layer.

For the VCSEL having a wavelength of 850 nm, the light cannot penetrate through the substrate, so that the substrate needs to be etched with an etching cavity which may co-operate with adjustment of the thickness of the absorbing layer, so that a portion of light may be absorbed by the absorbing layer to function as a feedback path of an auto power control, and a portion of the light may penetrate through the etching cavity.

Further benefits and advantages of the present invention will become apparent after a careful reading of the detailed description with appropriate reference to the accompanying drawings.

DETAILED DESCRIPTION OF THE INVENTION

Figure 1:
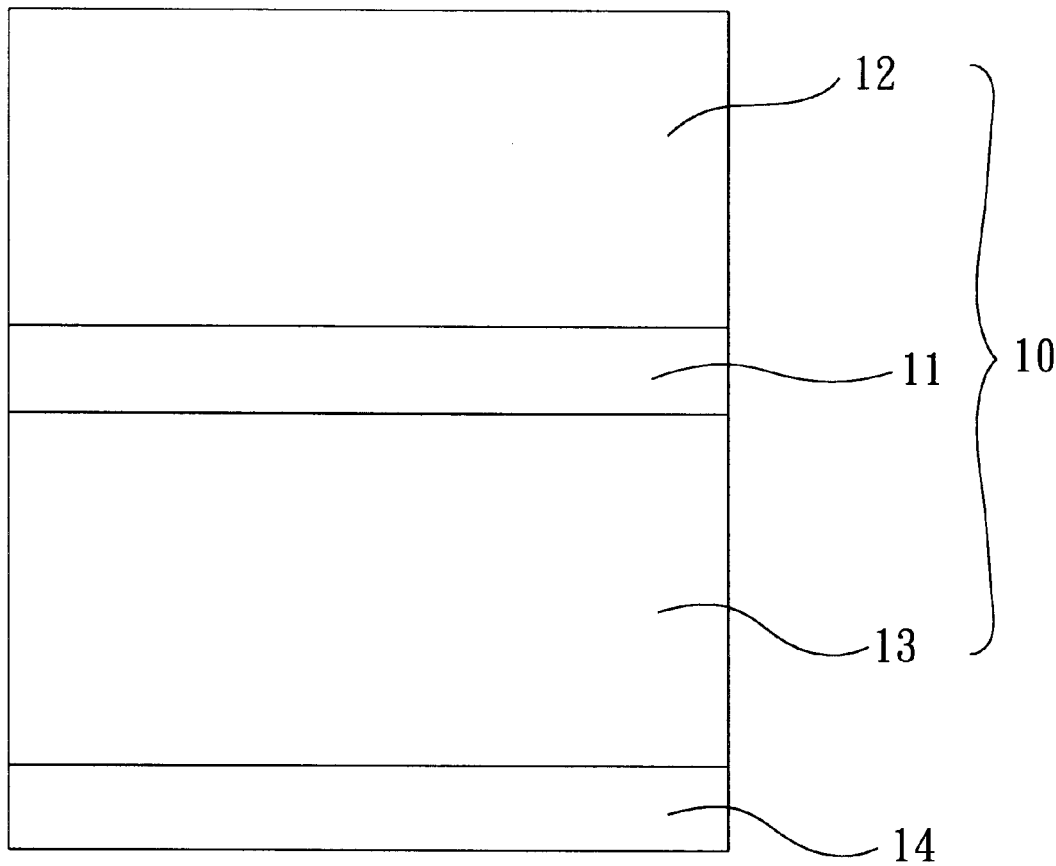
FIG. 1 is a structural schematic view of a conventional vertical cavity surface emitting laser in accordance with the prior art.
Figure 2:
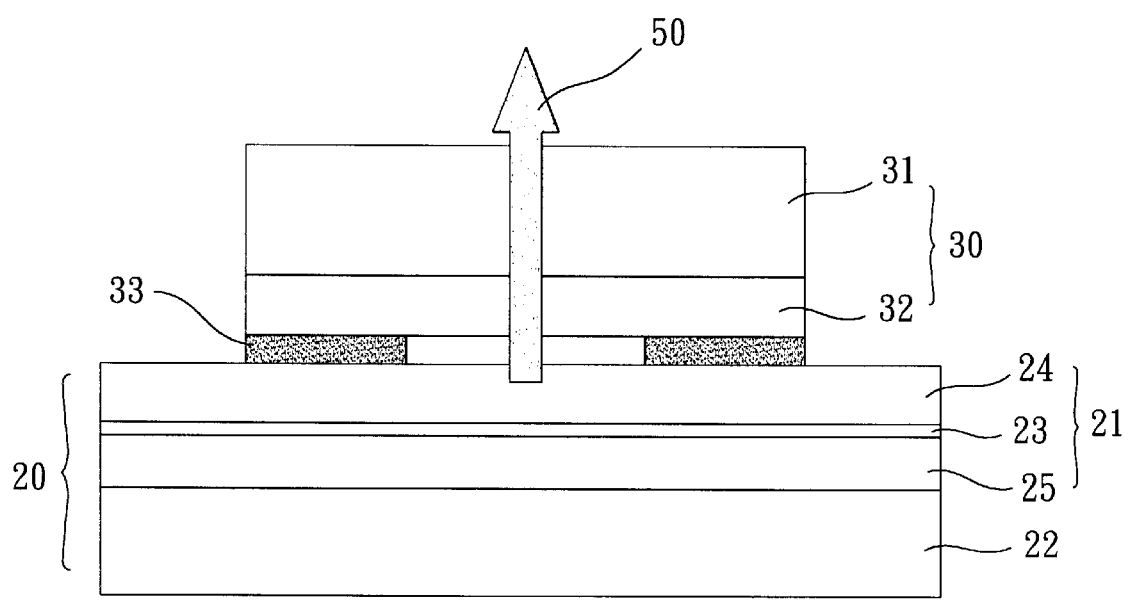
FIG. 2 is a structural schematic view of an auto feedback and photo attenuation structure of a vertical cavity surface emitting laser in accordance with a first embodiment of the present invention.

Referring to the drawings and initially to FIG. 2, a vertical cavity surface emitting laser (VCSEL) 20 in accordance with a first embodiment of the present invention comprises a epitaxy growth layer 21 that is formed on a substrate 22. The epitaxy growth layer 21 is a compound semi-conductor film formed by multiple layers made of different material, and includes an active region 23 having a first side coated with a P-distributed bragg reflector (P-DBR) 24, and a second side coated with a N-distributed bragg reflector (N-DBR) 25.

A monitor photodetector (MPD) 30 includes a substrate 31, and an absorbing layer 32 formed on one side of the substrate 31.

The absorbing layer 32 of the MPD 30 may mate with a proper combination interface 33 to be bonded on the P-DBR 24 of the VCSEL 20, so that the substrate 31 of the MPD 30 is far spaced from the VCSEL 20.

The absorbing layer 32 of the MPD 30 may absorb the power of light, and the absorbing efficiency thereof is defined as follows:

$$\text{the absorbing efficiency} = 1 - e^{-\alpha \chi}$$

wherein, a is the coefficient of material, and $\chi$ is the thickness of the absorbing layer 32. In the following embodiments, the absorbing efficiency of the absorbing layer 32 will satisfy the above-mentioned formula, and will not be further described in detail.

With regard to the VCSEL 20 having the wavelength of 1300 nm, the wavelength may conveniently pass through the substrate 31 of the MPD 30. Thus, the emitting light 50 of the VCSEL 20 may be directed to the MPD 30 along a single direction only. The thickness (that may be calculated from the above-mentioned formula) of the absorbing layer 32 may be adjusted, such that a portion of the power of the emitting light 50 may be absorbed by the absorbing layer 32 to function as the feedback path of an auto power control (APC), and a portion of the power of the emitting light 50 may penetrate through the substrate 31 of the MPD 30, and the penetration power will satisfy the requirement of the eye safety class I.

Figure 3:
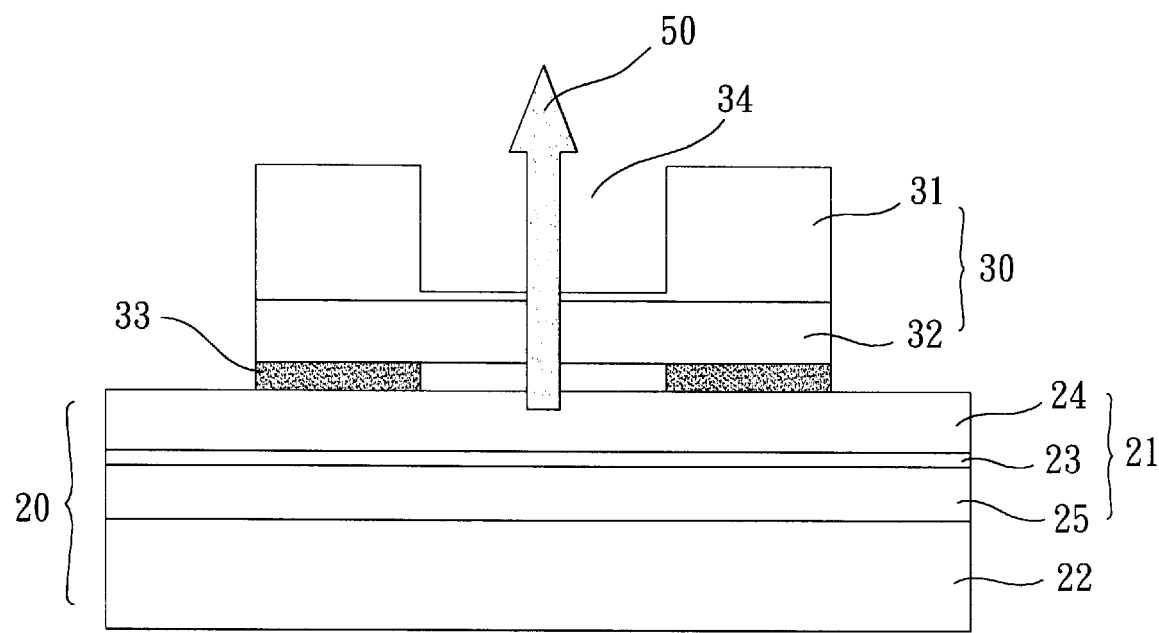
FIG. 3 is a structural schematic view of an auto feedback and photo attenuation structure of a vertical cavity surface emitting laser in accordance with a second embodiment of the present invention.

Referring to FIG. 3, the vertical cavity surface emitting laser (VCSEL) 20 in accordance with the second embodiment of the present invention comprises a epitaxy growth layer 21 that is formed on a substrate 22. The epitaxy growth layer 21 is a compound semi-conductor film formed by multiple layers made of different material, and includes an active region 23 having a first side coated with a P-distributed bragg reflector (P-DBR) 24, and a second side coated with a N-distributed bragg reflector (N-DBR) 25.

A monitor photodetector (MPD) 30 includes a substrate 31, and an absorbing layer 32 formed on one side of the substrate 31.

The absorbing layer 32 of the MPD 30 may mate with a proper combination interface 33 to be bonded on the P-DBR 24 of the VCSEL 20, so that the substrate 31 of the MPD 30 is far spaced from the VCSEL 20.

With regard to the VCSEL 20 having the wavelength of 850 nm, the thickness of the absorbing layer 32 may be changed to adjust the absorbing power, to function as the feedback path of an auto power control (APC). The light cannot pass through the substrate 31 of the MPD 30. Thus, an etching cavity 34 may be etched on the substrate 31, so that a portion of the light may pass through the substrate 31 of the MPD 30. In addition, the etching cavity 34 is far spaced from the VCSEL 20.

Accordingly, when the emitting light 50 of the VCSEL 20 is directed to the MPD 30, a portion of the power of the emitting light 50 may be absorbed by the absorbing layer 32, and the other portion of the power of the emitting light 50 may penetrate through the etching cavity 34, and the penetration power will satisfy the requirement of the eye safety class I.

Figure 4:
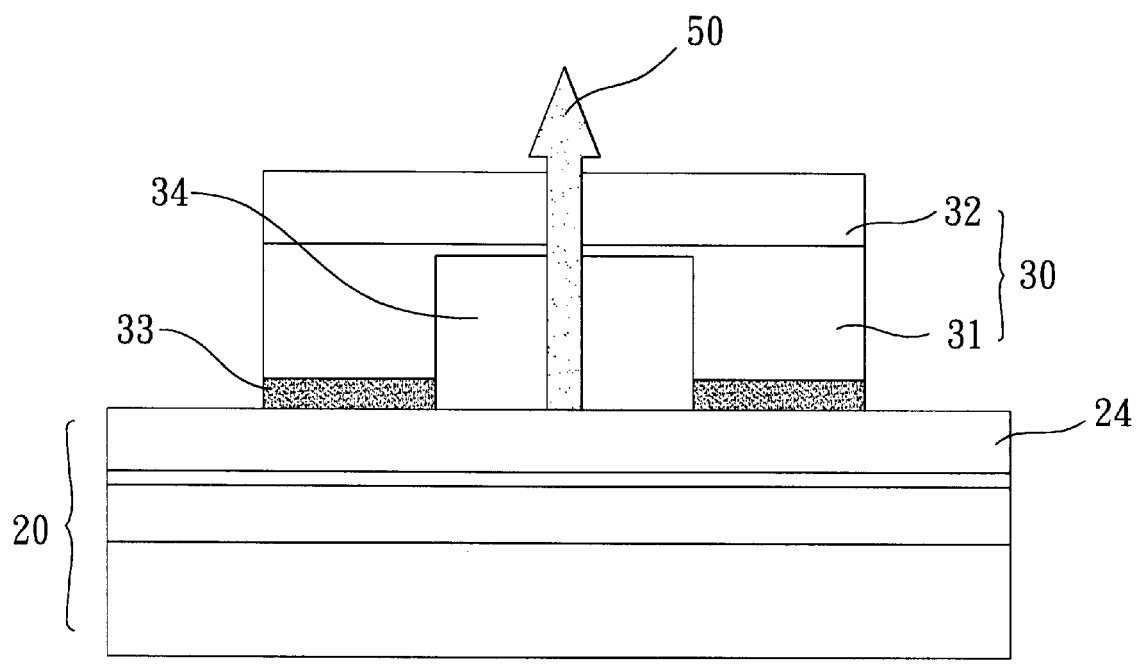
FIG. 4 is an equally structural schematic view of an auto feedback and photo attenuation structure of a vertical cavity surface emitting laser in accordance with the second embodiment of the present invention.

Referring to FIG. 4, with regard to co-operation of the MPD 30 and the VCSEL 20 having the wavelength of 850 nm, the substrate 31 of the MPD 30 may mate with the combination interface 33 to combine with the P-DBR 24 of the VCSEL 20. Thus, the etching cavity 34 in the substrate 31 is located between the absorbing layer 32 and P-DBR 24 of the VCSEL 20.

When the emitting light 50 of the VCSEL 20 is directed to the MPD 30, the emitting light 50 passes through the etching cavity 34, so that a portion of the power of the emitting light 50 may be absorbed by the absorbing layer 32, and the other portion of the power of the emitting light 50 may penetrate through the etching cavity 34.

Figure 5:
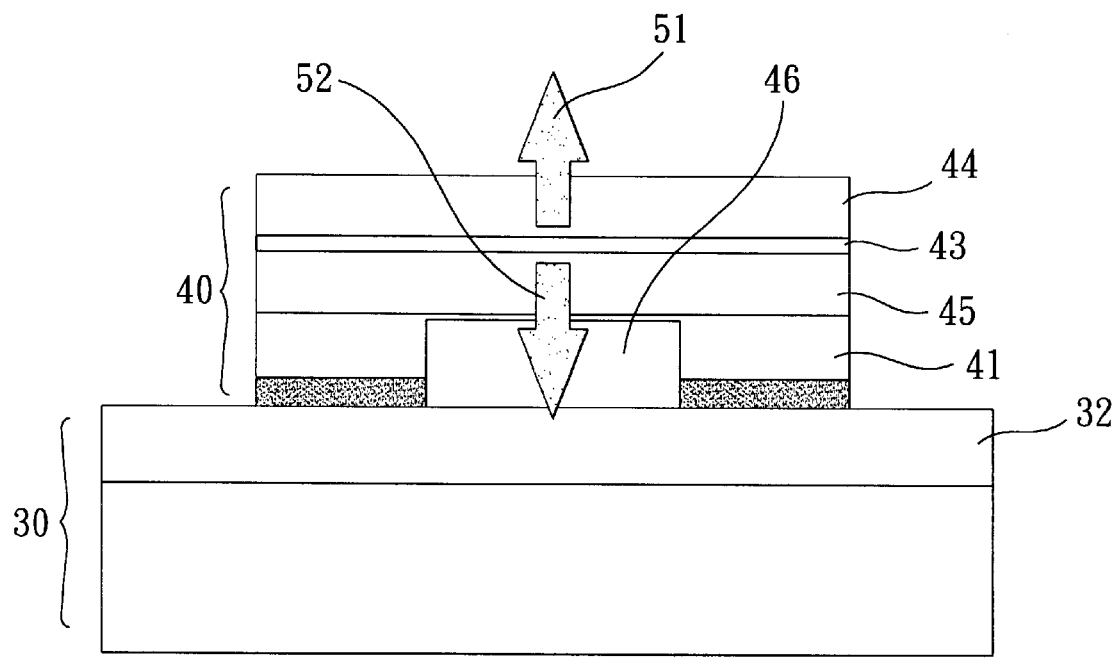
FIG. 5 is a structural schematic view of an auto feedback and photo attenuation structure of a vertical cavity surface emitting laser in accordance with a third embodiment of the present invention.

Referring to FIG. 5, a combination structure in accordance with the third embodiment of the present invention comprises a VCSEL 40, and a MPD. The reflectivity of the P-DBR 44 and the N-DBR 45 of the VCSEL 40 may be adjusted, such that a portion of emitting light 51 emitted from the active region 43 may penetrate the top face of the VCSEL 40, and a portion of the emitting light 52 emitted from the active region 43 may be directed toward the MPD 30.

The portion of emitting light 52 directed toward the MPD 30 may be used to function as the feedback basis of an auto power control (APC) after the portion of emitting light 52 is absorbed by the absorbing layer 32 of the MPD 30. The substrate 41 of the. VCSEL 40 is made of GaAs (Gallium Arsenic) which will absorb the light entering the substrate 41. Thus, an etching cavity. 46 may be etched on the substrate 41, so that the light may reach the absorbing layer 32 of the MPD 30 conveniently. Thus, the portion of emitting light 52 of the VCSEL 40 may pass through the etching cavity 46 to be absorbed by the absorbing layer 32 of the MPD 30, thereby functioning as the feedback basis of an auto power control (APC).

Accordingly, the output power may be obtained by adjusting the reflectivity of the P-DBR 44 and the N-DBR 45 of the VCSEL 40, and by adjusting the thickness of the absorbing layer 32 of the MPD 30, so as to satisfy the requirement of the eye safety class I, and the requirement of the feedback basis of an auto power control (APC).

The VCSEL and MPD of each embodiment may be manufactured respectively, and the control and fabrication of the thickness of the absorbing layer of the MPD are much easier than the control of the epitaxy growth of the VCSEL, so that the productive quality, the feature of the members, and the reliability may satisfy the predetermined requirement easily.

In addition, all of the members of the present invention maintain a planar structure which may use the existing surface mount technology (SMT), and may mate with the existing TO-can architecture, thereby satisfying the requirements of a manufacturing process with low cost and mass production.

While the preferred embodiment of the present invention has been shown and described, it will be apparent to those skilled in the art that various modifications may be made in the embodiment without departing from the spirit of the present invention. Such modifications are all within the scope of the present invention.

What is claimed is:

1. An auto feedback and photo attenuation structure of a vertical cavity surface emitting laser, comprising:

a vertical cavity surface emitting laser including a P-distributed bragg reflector;

a monitor photodetector including a substrate, and an absorbing layer formed on one side of the substrate; and a combination interface mounted between the P-distributed bragg reflector of the vertical cavity surface emitting laser and the monitor photodetector, such that the vertical cavity surface emitting laser and the monitor photodetector are combined with each other by the combination interface;

wherein, a portion of emitting light is absorbed by the absorbing layer to function as a feedback basis of an auto power control, and a portion of the emitting light penetrates through the absorbing layer.

2. The auto feedback and photo attenuation structure of a vertical cavity surface emitting laser in accordance with claim 1, wherein the vertical cavity surface emitting laser has a wavelength of 1300 nm, and the absorbing layer of the monitor photodetector is connected with the P-distributed bragg reflector of the vertical cavity surface emitting laser, so that the substrate of the monitor photodetector is far spaced from the vertical cavity surface emitting laser.

3. The auto feedback and photo attenuation structure of a vertical cavity surface emitting laser in accordance with claim 1, wherein the vertical cavity surface emitting laser has a wavelength of 850 nm, and the absorbing layer of the monitor photodetector is connected with the P-distributed bragg reflector of the vertical cavity surface emitting laser, so that the substrate of the monitor photodetector is far spaced from the vertical cavity surface emitting laser, and an etching cavity is formed in the substrate for penetration of a portion of emitting light that passes through the absorbing layer.

4. The auto feedback and photo attenuation structure of a vertical cavity surface emitting laser in accordance with claim 1, wherein the vertical cavity surface emitting laser has a wavelength of 850 nm, and the substrate of the monitor photodetector is connected with the P-distributed bragg reflector of the vertical cavity surface emitting laser, so that the absorbing layer of the monitor photodetector is far spaced from the vertical cavity surface emitting laser, and an etching cavity is formed in the substrate so that the light reaches the absorbing layer, and a portion of light is absorbed by the absorbing layer and a portion of light penetrates through the absorbing layer.

5. The auto feedback and photo attenuation structure of a vertical cavity surface emitting laser in accordance with claim 1, wherein the vertical cavity surface emitting laser emits light toward the monitor photodetector along one direction only.

6. The auto feedback and photo attenuation structure of a vertical cavity surface emitting laser in accordance with claim 1, wherein the vertical cavity surface emitting laser emits light along a first direction toward the monitor photodetector, and along a second direction opposite to the monitor photodetector.

7. The auto feedback and photo attenuation structure of a vertical cavity surface emitting laser in accordance with claim 6, wherein the vertical cavity surface emitting laser emits light toward two directions, and has a wavelength of 850 nm, the absorbing layer of the monitor photodetector is connected with the substrate of the vertical cavity surface emitting laser, and an etching cavity is formed in the substrate of the vertical cavity surface emitting laser, so that a portion of light of the vertical cavity surface emitting laser passes through the etching cavity to be absorbed by the absorbing layer.

* * * * *